(12) United States Patent
Park et al.

(10) Patent No.: US 10,686,420 B2
(45) Date of Patent: Jun. 16, 2020

(54) AUDIO SIGNAL PROCESSING METHOD AND APPARATUS FOR CONTROLLING LOUDNESS LEVEL

(71) Applicant: GAUDIO LAB, INC., Seoul (KR)

(72) Inventors: Kyutae Park, Seoul (KR); Jeonghun Seo, Seoul (KR); Taegyu Lee, Seoul (KR); Hyunoh Oh, Gyeonggi-do (KR); Sangbae Chon, Seoul (KR)

(73) Assignee: GAUDIO LAB, INC., Seoul (KR)

( * ) Notice: Subject to any disclaimer, the term of this patent is extended or adjusted under 35 U.S.C. 154(b) by 0 days.

(21) Appl. No.: 16/396,632

(22) Filed: Apr. 26, 2019

(65) Prior Publication Data
US 2019/0334496 A1   Oct. 31, 2019

(30) Foreign Application Priority Data

Apr. 27, 2018   (KR) .................. 10-2018-0049226
May 3, 2018   (KR) .................. 10-2018-0051140
May 4, 2018   (KR) .................. 10-2018-0051719
Jun. 6, 2018   (KR) .................. 10-2018-0073337

(51) Int. Cl.
*H03G 7/00*   (2006.01)
*H04R 3/00*   (2006.01)

(52) U.S. Cl.
CPC ............... *H03G 7/002* (2013.01); *H04R 3/00* (2013.01); *H04R 2430/01* (2013.01)

(58) Field of Classification Search
CPC ........ H03G 3/3005; H03G 3/20; H03G 3/301; H03G 5/005; H03G 7/00; H03G 7/002; H03G 7/007; H04R 2430/01
See application file for complete search history.

(56) References Cited

U.S. PATENT DOCUMENTS

2008/0253586 A1* 10/2008 Wei .................. H03G 5/165
                                                        381/107
2014/0140537 A1*  5/2014 Soulodre ............ H03G 5/005
                                                        381/104
2015/0207481 A1*  7/2015 Duwenhorst .......... H03G 7/002
                                                        381/107

* cited by examiner

*Primary Examiner* — Kile O Blair
(74) *Attorney, Agent, or Firm* — Ladas & Parry, LLP

(57) ABSTRACT

The audio signal processing apparatus includes a processor configured to adjust an output loudness level of an input content. The processor is configured to obtain a loudness information analyzed from the input content, obtain a loudness gain applied to the input content based on the loudness information and a target loudness level, and adjust the output loudness level of the input content based on the loudness gain. In this case, in a first section among an entire section in which the input content is reproduced, the loudness gain is limited based on a first gain allowable range, and in a second section following the first section, the limitation on the loudness gain is released.

20 Claims, 5 Drawing Sheets

AUDIO SIGNAL PROCESSING METHOD AND APPARATUS FOR CONTROLLING LOUDNESS LEVEL

CROSS-REFERENCE TO RELATED APPLICATIONS

This application claims priority to and the benefit of Korean Patent Application No. 10-2018-0049226 filed in the Korean Intellectual Property Office on Apr. 27, 2018, Korean Patent Application No. 10-2018-0051140 filed in the Korean Intellectual Property Office on May 3, 2018, Korean Patent Application No. 10-2018-0051719 filed in the Korean Intellectual Property Office on May 4, 2018 and Korean Patent Application No. 10-2018-0073337 filed in the Korean Intellectual Property Office on Jun. 26, 2018, the entire contents of which are incorporated herein by reference.

TECHNICAL FIELD

The present disclosure relates to an audio signal processing method and apparatus for reproducing an audio signal effectively, and more particularly, to an audio signal processing method and apparatus for adjusting an output loudness level of the audio signal of the content to provide an audio signal that is more immersive to the user.

BACKGROUND ART

As the method of providing an audio signal to the user is digitized in the analog method, a wider volume area may be expressed. In addition, volume of the audio signal is diversified according to the content corresponding to the audio signal. This is because in an audio content production process, the intended loudness of the audio content may be set differently for each audio content. Accordingly, international standards groups such as the International Telecommunication Union (ITU) and the European Broadcasting Union (EBU) have issued standards for audio loudness. However, there is a problem that it is difficult to apply the standards issued by the international standards groups because the method and the standards for measuring loudness are different in each country.

The producers of the contents try to produce the contents with relatively loudly mixed contents and provide them to the users. This is because of the psychoacoustical characteristic which is recognized that the sound quality of the audio signal is improved when the volume of the audio signal is increased. As a result, there is a competitive landscape called a Loudness War. This causes a difference in loudness between contents or a plurality of contents internally, and the user repeatedly adjusts the volume of the apparatus on which the contents are reproduced, and it may suffer from the inconvenience. Therefore, there is a need for a technique for normalizing the loudness of the audio content for the convenience of the user using the content reproduction apparatus.

SUMMARY OF THE INVENTION

An embodiment of the present disclosure is to provide an audio signal processing method for reproducing content including audio signal, which may adjust an output loudness level of content efficiently in an audio signal processing method for reproducing content including audio signal.

According to an embodiment of the present disclosure, an audio signal processing apparatus including: a processor configured to adjust an output loudness level of an input content, wherein the processor is configured to: obtain a loudness information analyzed from the input content, obtain a loudness gain applied to the input content based on the loudness information and a target loudness level, and adjust the output loudness level of the input content based on the loudness gain is provided. In this case, in a first section among an entire section in which the input content is reproduced, the loudness gain may be limited based on a first gain allowable range, and in a second section following the first section, the limitation on the loudness gain may be released.

The first period may be an initial period starting from a specific time point and having a predetermined duration.

In the second section, the loudness gain may be limited based on a second gain allowable range that is wider than at least the first gain allowable range.

The loudness gain that is applied to the input content may not include a value out of the first gain allowable range in the first section, and the loudness gain that is applied to the received content may include a value out of the first gain allowable range in the second section.

The processor may obtain additional information related to the input content and determine the first gain allowable range based on the additional information.

The processor may obtain information on a genre of the input content from the additional information. In this case, the first gain allowable range is determined based on the genre of the input content.

The processor may obtain a duration of the first section based on the additional information. In this case, the loudness gain of the input content reproduced during the duration of the first section from a specific time point at which the first section starts is limited based on the first gain allowable range.

The processor may obtain information on a length of the input content from the additional information. In this case, the duration of the first section is shorter than duration of a section in which a loudness gain of other contents of which a length is longer than the length of the input content is limited.

The processor may obtain a loudness measurement value per measurement window for the input content, and obtain the loudness information based on the loudness measurement value per measurement window. In this case, the measurement window represents a unit time used for obtaining one loudness measurement value.

When the loudness measurement value is smaller than a first predetermined loudness level during a transition section that is a predetermined time or more from a specific time point in the second section, the loudness gain of the input content reproduced during the duration of the first section after the transition section is limited based on the first gain allowable range.

The processor may the processor is configured to obtain the loudness information based on a plurality of loudness measurement values excluding loudness measurement values measured between a time point at which the transition section starts and a time point at which loudness over a second predetermined level is measured from among a plurality of loudness measurement values measured from a time point at which reproduction of the input content starts to a current time point.

The audio signal processing apparatus may further include a storage storing a plurality of loudness measurement values. The processor may delete data with respect to loudness measurement values pre-stored in the storage unit and measured between the time point at which the transition section starts and the time point at which loudness over the second predetermined level is measured.

The processor may obtain a first loudness gain based on the first loudness information for the input content reproduced until the transition section and obtain a second loudness gain based on the second loudness information for the input content reproduced until the current time point after the transition section, obtain a loudness gain of the input content to be reproduced after the current time point by weighted summing the first loudness gain and the second loudness gain. In this case, a first weight applied to the first loudness gain may be smaller than a second weight applied to the second loudness gain.

The loudness information may include an integrated loudness level indicating a loudness measurement value accumulated from a set point set by the audio signal processing apparatus. In this case, the processor may obtain the loudness gain of the input content based on the integrated loudness level. Also, if the difference between the loudness measurement at the current time and the integrated loudness level is greater than a predetermined value, the set-up time may be reset to the current time.

The set-up time may be reset to end time of the transition section when the loudness measurement value is smaller than a first predetermined loudness level during a transition section that is a predetermined time or more from a specific time point of the second period.

The additional information contains at least one of information indicating a length, a genre, popularity, a viewing count, a loudness dynamic range, or content provider of the input content.

According to an embodiment of the present disclosure, a method of processing an audio signal including the step of: obtaining loudness information analyzed from the input content; obtaining a loudness gain applied to the input content based on the loudness information and a target loudness level; and adjusting the output loudness level of the input content based on the loudness gain, wherein in a first section among an entire section in which the input content is reproduced, the loudness gain is limited based on a first gain allowable range, and in a second section following the first section, the limitation on the loudness gain is released is provided.

The apparatus and method according to an embodiment of the present disclosure may effectively normalize the loudness level of an audio signal in reproducing contents including an audio signal. Also, the apparatus and method according to an embodiment of the present disclosure may provide a user with convenience for sound quality improvement and volume control.

Particularly, according to an embodiment of the present disclosure, it is possible to control the loudness level without causing sound quality deterioration. In addition, the apparatus for processing an audio signal according to an embodiment of the present disclosure may obtain loudness information in real time to provide output contents having a more stable output loudness level. It is also possible to perform loudness normalization close to the loudness that a listener actually perceives.

DETAILED DESCRIPTION

Figure 1:
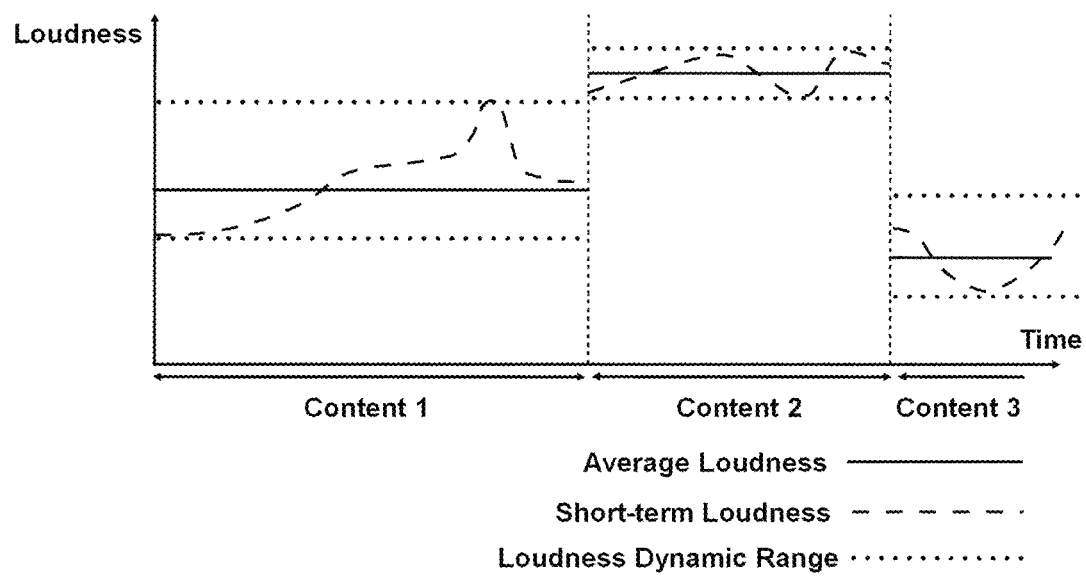
FIG. 1 is a diagram illustrating a loudness level varying with time during reproduction of a plurality of contents according to an embodiment of the present disclosure.

Hereinafter, embodiments of the present invention will be described in detail with reference to the accompanying drawings so that the embodiments of the present invention may be easily carried out by those skilled in the art. However, the present invention may be implemented in many different forms and is not limited to the embodiments described herein. Some parts of the embodiments, which are not related to the description, are not illustrated in the drawings to clearly describe the embodiments of the present disclosure. Like reference numerals refer to like elements throughout the description. When it is mentioned that a certain part "includes" or "comprises" certain elements, the part may further include other elements, unless otherwise specified.

The present disclosure relates to a method by which an audio signal processing apparatus adjusts an output loudness level of an input content. In the present disclosure, the input content may be content that contains an audio signal. In the present disclosure, the input content may be referred to as an input audio signal. A loudness may indicate the magnitude of the auditory perceived sound. A loudness level may be a numerical value representing the loudness. For example, the loudness level may be represented in units of Loudness-Weighted relative to Full Scale (LKFS) or Loudness Unit relative to Full Scale (LUFS). Also, the loudness level may be represented in units of such as sone or phon.

Hereinafter, the loudness of an audio signal will be described with reference to FIG. 1. FIG. 1 is a diagram illustrating a loudness level varying with time during reproduction of a plurality of contents according to an embodiment of the present disclosure. Referring to FIG. 1, average loudness, short-term loudness, and loudness dynamic range varying over time are shown. Average loudness level may be a single loudness value corresponding to one content. The average loudness level may be different for each content (e.g. content1, content2, content3). In FIG. 1, the solid line represents the average loudness level for each of the contents (e.g. content1, content2, content3).

The short-term loudness level may be a loudness measurement value for a portion of the content. In this case, the portion of the content may be a part included in one measurement window. The audio signal processing apparatus may obtain a plurality of short-term loudness levels for a single content. Also, the average loudness level may be an average of the plurality of short-term loudness levels. In FIG. 1, each of the plurality of contents reproduced and transitioned has different loudness characteristics.

For example, when different contents are transitioned in a platform that provides a video providing service, the advertisement contents may be inserted between the contents. In this case, the audio signal processing apparatus may be difficult to maintain a loudness level within a certain range. In addition, the difference in loudness dynamic range between different contents may be large. In such an environment, the audio signal processing apparatus may be difficult to provide a level of loudness within a range desired by a listener.

Specifically, when the content is transitioned, the listener may first recognize that the short-term loudness level is rapidly changed. Thus, the listener may have to adjust the volume of the device that outputs the audio signal. Also, the listener may need to adjust the volume again to set the proper gain according to the average loudness while the transitioned content is being reproduced. For example, when the transitioned contents are reproduced according to the volume adjusted based on the loudness of the initial section of the transitioned contents, the loudness level may increase rapidly or decrease rapidly depending on the characteristics of the contents. If the subject matter of the content may not be figured out due to a sudden increase or decrease in the loudness level, the listener may need to adjust the volume of the device that outputs the audio signal again.

Accordingly, the audio signal processing apparatus according to an embodiment of the present disclosure may control the output loudness level of the input content to increase the convenience of the listener. Specifically, the audio signal processing apparatus may adjust the loudness level based on the loudness gain of the input content. In this case, the loudness gain applied to the content inputted in a specific section may be limited based on a gain allowable range.

According to an embodiment of the present disclosure, the loudness level of the input content, which is generated based on a different standard or generated without a specific standard, may be normalized based on a target loudness level. Here, the target loudness level may be the loudness level that the audio signal processing apparatus desires to output. For example, the target loudness level may be set by the content provider of the input content. In this case, the audio signal processing apparatus may receive information about the target loudness with the input content. In addition, the target loudness level may be set to a different value depending on the genre of the input content. In this case, the audio signal processing apparatus may determine the target loudness level based on the genre of the input content. The target loudness level may be set to a default value pre-stored in the audio signal processing apparatus. In this case, the target loudness level may be set to a value irrelevant to the genre of the input content or the input content. The audio signal processing apparatus may adjust the output loudness level of the input content based on the target loudness level.

According to one embodiment, the audio signal processing apparatus may obtain a loudness gain based on the relationship between the loudness level of the input content and the target loudness level. The relationship between the loudness level and the target loudness level of the input content may include a difference or a ratio between the loudness level and the target loudness level of the input content.

For example, the audio signal processing apparatus may obtain the loudness gain based on the relationship between a representative loudness level and the target loudness level of the input content. Here, the representative loudness level may be a loudness level representing the loudness level of the entire input content. The audio signal processing apparatus may receive the representative loudness level of the input content with the input content. Alternatively, the audio signal processing apparatus may obtain the representative loudness level based on a loudness information analyzed from the input content. In this case, the audio signal processing apparatus may obtain the loudness information based on loudness measurement values of the input content.

Further, the audio signal processing apparatus may adjust the output loudness level of the input content based on the loudness gain. Specifically, the audio signal processing apparatus may apply the loudness gain to the input content to obtain an output audio signal whose loudness level is adjusted by.

Meanwhile, under certain circumstances, it may be difficult for the audio signal processing apparatus to obtain the representative loudness level of the input content until the reproduce of the input content is completed. For example, when certain content is transmitted in real time, it may be difficult for the audio signal processing apparatus to obtain the loudness characteristics of the entire content until the reception of the entire section of the content is completed. Accordingly, the audio signal processing apparatus according to an embodiment of the present disclosure may measure the loudness of the received content in real time to perform loudness normalization.

Figure 2:
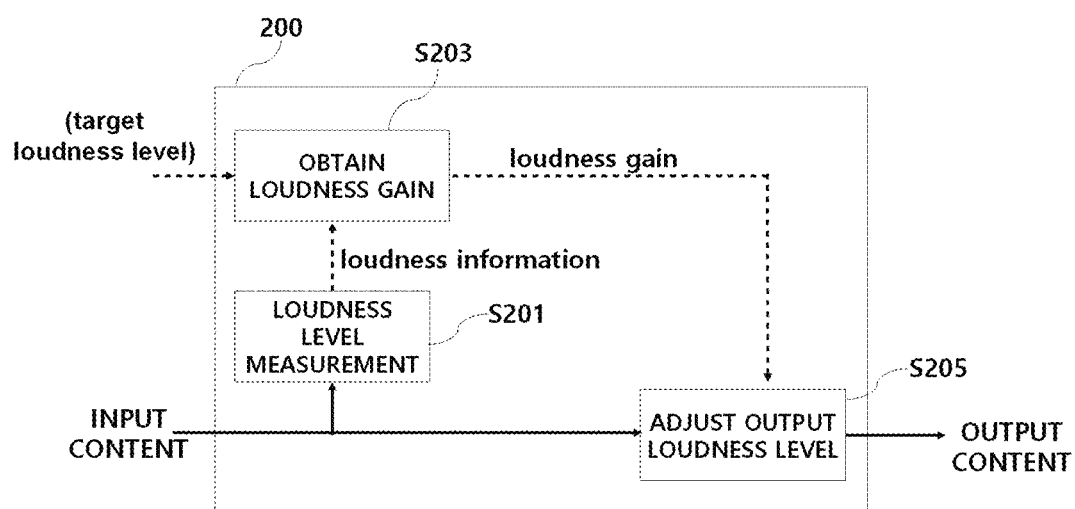
FIG. 2 is a block diagram illustrating an operation of an audio signal processing apparatus according to an embodiment of the present disclosure.

Hereinafter, a method for adjusting an output loudness level of an input content by an audio signal processing apparatus according to an embodiment of the present disclosure will be described with reference to FIG. 2. FIG. 2 is a block diagram illustrating an operation of an audio signal processing apparatus 200 according to an embodiment of the present disclosure. In FIG. 2, a series of operations for a loudness normalization of the input content are shown to be performed by the audio signal processing apparatus, but the present disclosure is not limited thereto. For example, some of the operations described with reference to FIG. 2 may be performed through a server other than the audio signal processing apparatus.

First, the audio signal processing apparatus 200 may receive the input content. The input content may be an input audio signal consist of a plurality of frames. Next, the audio signal processing apparatus 200 may measure the loudness level of the input content (S201). The audio signal processing apparatus 200 may obtain loudness measurement values of the audio signal using a loudness filter based on the auditory scale. Specifically, the loudness filter may be at least one of an inverse-filter of equal-loudness contours, or a K-weighted summing filter approximating the equal-loudness contours.

For example, the audio signal processing apparatus 200 may apply a loudness filter to at least a portion of the received input content to obtain a loudness measurement value. Here, the portion may be a unit time used for obtaining one loudness measurement value. The portion may include at least one frame. In the present disclosure, the unit time used for obtaining one loudness measurement value may be referred to as a measurement window.

The audio signal processing apparatus 200 may obtain the loudness measurement value per measurement window for the input content. In this case, the obtained loudness measurement value may be an instantaneous loudness level or a short loudness level depending on the length of the measurement window. The instantaneous loudness level may be a loudness measurement value measured over a short time period relative to the short-term loudness level. For example, the length of the measurement window used for obtaining one instantaneous loudness level may be 400 milliseconds (ms). In addition, the length of the measurement window used for obtaining one short-term loudness level may be 3 seconds. However, the present disclosure is not limited thereto. The length of the measurement window for loudness analysis may be different depending on an input content. According to one embodiment, the length of the measurement window may be determined based on additional information of the input content. A method for determining the length of the measurement window by the audio signal processing apparatus will be described later with reference to FIG. 8.

Next, the audio signal processing apparatus may obtain loudness information of the input content based on the loudness measure for the input content. The loudness information may include at least one loudness measurement value for the input content. In addition, the loudness information may include information calculated based on loudness measurement values for the input content. The audio signal processing apparatus may update the loudness information in real time. For example, the loudness information may include at least one of an integrated loudness level, a short-term loudness level, or an instantaneous loudness level. The audio signal processing apparatus may obtain the integrated loudness level representative of a plurality of loudness measurement values accumulated from a time point at which the loudness measurement of the input content is started until the current time point.

In the present disclosure, the integrated loudness level may represent a loudness measurement valued integrated from a set-up time set in the audio signal processing apparatus. For example, the integrated loudness level may be obtained based on an average of valid loudness measurement values measured between the set-up time point and the current time point. Here, the valid loudness measurement values may be loudness measurement values that satisfy at least one criteria requirement among the plurality of loudness measurement values between the setup time point and the current time point.

For example, the valid loudness measurement values may be loudness measure values whose loudness level is above a certain level. First, the audio signal processing apparatus may calculate a first average with respect to loudness measurement values of which the loudness level is equal to or greater than a first threshold value among the plurality of loudness measurement values. Here, the first threshold value may be a value set based on the minimum audible size. Next, the audio signal processing apparatus may calculate a second average with respect to loudness measurement values of which the loudness level is equal to or greater than a second threshold value among the loudness measurement values used for the calculation of the first average. Here, the second threshold value may be a value obtained by subtracting a predetermined value from the first average value. The audio signal processing apparatus may use the second average as an integrated loudness level of the input content. Meanwhile, the audio signal processing apparatus may reset the set-up time for the integrated loudness level according to specific requirements. A method for the audio signal processing apparatus to reset the set-up time for the integrated loudness level will be described later with reference to FIG. 6.

Next, the audio signal processing apparatus may obtain a loudness gain applied to the input content based on the obtained loudness information (S203). Specifically, the audio signal processing apparatus may obtain the loudness gain based on the loudness information and the target loudness level. According to one embodiment, the audio signal processing apparatus may obtain the loudness gain applied to a particular frame of the input content. The loudness gain applied to each frame in a specific section of the input content may be dynamically adjusted with time. The loudness gain applied to each frame except for a specific section may be a static gain that is not dynamically adjusted. Also, the loudness gain may be limited to a value within a certain range in some specific section of the input content. This will be described later in detail with reference to FIG. 3.

Next, the audio signal processing apparatus may adjust the output loudness level of the input content based on the loudness gain (S205). For example, the audio signal processing apparatus may adjust the output loudness level by applying the loudness gain to the input content. According to one embodiment, the loudness gain may be applied to each frame constituting the input content. In this case, the audio signal processing apparatus may adjust the output loudness level of the input content by multiplying the audio signal corresponding to each frame by the loudness gain. The audio signal processing apparatus may obtain an output content whose output loudness level is adjusted by the loudness gain from the input content. Further, the audio signal processing apparatus may output the obtained output content. For example, the audio signal processing apparatus may reproduce the output content. Alternatively, the audio signal processing apparatus may deliver the output content to the reproduce device via the wired/wireless interface.

Additionally, the audio signal processing apparatus may control a dynamic range of the adjusted output loudness level. If the output loudness level for a particular frame of the input content is out of a predetermined dynamic range, then sound quality distortion due to clipping may occur. The audio signal processing apparatus may control the dynamic range of the output loudness level based on a predetermined dynamic range. For example, an audio signal processing apparatus may use a process, such as a limiter and a dynamic range compressor (DRC), to control the dynamic range of the output loudness level.

As described above, when the input content being reproduced in the audio signal processing apparatus is received in real time, the audio signal processing apparatus may be difficult to find out the loudness characteristic of the entire input content based only on the initial section of the content. Specifically, if the length of the input content is as short as the advertisement content, it is difficult to have a silent section from the beginning to the end of the content, and the loudness range may be limited. Accordingly, the loudness information analyzed based on the initial section of the input content may be used to reflect the loudness characteristic of the entire input content. On the other hand, if the length of the input content is long such as a movie, a drama, or a sports relay, the possibility of the silent section is relatively high in the initial section. Also, the loudness range of the input content may be relatively large compared to the short content such as the advertisement. Accordingly, the loudness characteristics may be different for each section of the input content. In this case, the loudness information analyzed based on the initial section of the input content may be difficult to reflect the loudness characteristic of the entire input content.

Accordingly, in the initial section of the input content, the loudness gain obtained based on the relatively insufficient loudness information may be applied to the input content that is subsequently reproduced. As a result, the output loudness level of the input content may be rapidly increased or decreased. Therefore, the audio signal processing apparatus according to an embodiment of the present disclosure may adjust the output loudness level of the input content using different loudness normalization methods for each reproduction section of the input content.

Figure 3:
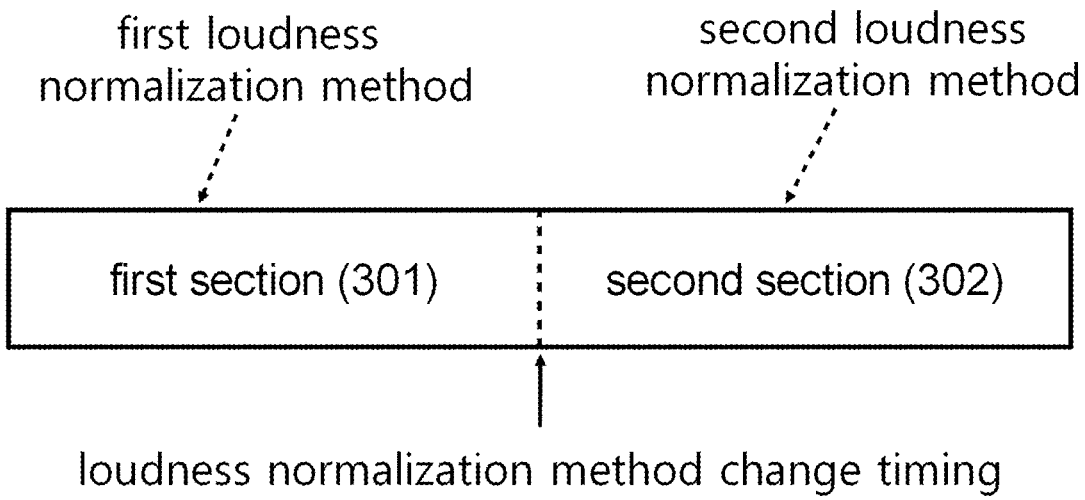
FIG. 3 is a diagram illustrating a method of limiting a loudness gain of an input content by an audio signal processing apparatus according to an embodiment of the present disclosure.

According to an embodiment of the present disclosure, the audio signal processing apparatus may limit the gain applied to the input content within a specific range during a specific section of the entire section in which the input content is reproduced. Hereinafter, a method for limiting the loudness gain of the input content according to an embodiment of the present disclosure will be described with reference to FIG. 3. FIG. 3 is a diagram illustrating a method of limiting a loudness gain of an input content by an audio signal processing apparatus according to an embodiment of the present disclosure.

Referring to FIG. 3, the audio signal processing apparatus may adjust the output loudness level of the input content using a first loudness normalization method in a first section 301. In addition, the audio signal processing apparatus may adjust the output loudness level of the input content using a second loudness normalization method in a second section 302. In this case, the first loudness normalization method and the second loudness normalization method may be different each other. For example, the first loudness normalization method may include an operation to limit the loudness gain. In addition, the second loudness normalization method may include an operation to release the limitation on the loudness gain.

According to an embodiment of the present disclosure, the loudness gain applied to the input content during a gain limitation section, among the entire section in which the input content is reproduced, may be limited based on a gain allowable range. Here, the gain limitation section may be an initial period starting from a specific time point and having a specific duration. For example, the gain limitation section may be an initial part of the entire section in which the input content is reproduced. According to an exemplary embodiment, the specific time point at which the gain limitation section starts may be an initial time point within a predetermined time with respect to a time point at which the input content starts to be reproduced. For example, the specific time point may be the time point at which the input content begins to be reproduced. According to another embodiment, the specific time point at which the gain limitation section starts may be a time point that satisfies a predetermined requirement. For example, the time point at which the predetermined requirement is satisfied may be the time at which the input content is transitioned from the first content to the second content. This will be described later with reference to FIG. 5.

In addition, the gain allowable range may indicate a range of applicable gain for the input content in the gain limitation section. For example, the audio signal processing apparatus may obtain the loudness gain based on loudness information and a target loudness level analyzed from the input content. In this case, if the obtained loudness gain is a value out of the gain allowable range, the audio signal processing apparatus may correct the obtained loudness gain. The audio signal processing apparatus may obtain the loudness gain corrected from the obtained loudness gain based on the gain allowable range. In addition, the audio signal processing apparatus may adjust the output loudness level of the input content based on the corrected loudness gain.

Specifically, the gain allowable range may be defined using at least one of a minimum gain value and a maximum gain value. For example, the audio signal processing apparatus may limit the loudness gain based on the maximum gain value. If the obtained loudness gain is larger than the maximum gain value, the audio signal processing apparatus may correct the obtained loudness gain. In this case, the corrected loudness gain may be the maximum gain value. The audio signal processing apparatus may limit the loudness gain based on the minimum gain value. If the obtained loudness gain is smaller than the minimum gain value, the audio signal processing apparatus may correct the obtained loudness gain. In this case, the corrected loudness gain may be a minimum gain value. Further, the audio signal processing apparatus may limit the loudness gain based on the maximum gain value and the minimum gain value. If the obtained loudness gain is smaller than the minimum gain value or larger than the maximum gain value, the audio signal processing apparatus may correct the obtained loudness gain. In this case, the gain allowable range may be determined based on additional information. For example, the maximum gain value and/or the minimum gain value may be determined based on information on a genre included in the additional information of the input content.

According to one embodiment, duration of the gain limitation section may be set differently depending on the input content. For example, the audio signal processing apparatus may determine the duration of the gain limitation section based on the additional information of the input content. Specifically, the duration of the gain limitation section may be determined differently depending on the length of the input content. This will be described in detail with reference to FIG. 7.

In addition, the limitation on the loudness gain may be released in the remaining section excluding the above-described gain limitation section among the entire section in which the input content are reproduced. For example, the audio signal processing apparatus may release the limitation on the loudness gain in a limitation release section subsequent to the gain limitation section.

In FIG. 3, the audio signal processing apparatus may limit the loudness gain of the input content in the first section 301. In addition, the audio signal processing apparatus may release the limitation on the loudness gain in a second section 302 following the first section 301. In this case, the first section 301 may indicate the gain limitation section, and the second section 302 may indicate the limitation release section. Duration of the limitation release section may be determined in a manner different from the duration of the gain limitation section. For example, the duration of the limitation release section may not be a fixed length. Specifically, the duration of the limitation release section may be from the end of the gain limitation section to the end of the reproduction of a specific content. Alternatively, the limitation release section may be from the end of the gain limitation section to start of new gain limitation section.

As described above, the audio signal processing apparatus according to an embodiment of the present disclosure may adjust the output loudness level by distinguishing between the gain limitation section and the limitation release section to prevent the output loudness level from being excessively amplified in the initial period of the input content. In addition, the audio signal processing apparatus may prevent the output loudness level from being excessively reduced in the initial section of the input content.

Meanwhile, in accordance with an embodiment of the present disclosure, the loudness gain in the second section 302 following the first section 301 may be limited based on new gain allowable range. For example, in the first section 301, the loudness gain may be limited based on the first gain allowable range. Next, in the second section 302, the audio signal processing apparatus may release the restriction based on the first gain allowable range for the loudness gain. Specifically, the loudness gain applied to the input content in the first section 301 may not include a value out of the first gain allowable range. Also, the loudness gain applied to the input content in the second section 302 may include a value out of the first gain allowable range.

In addition, the audio signal processing apparatus may limit the loudness gain based on a second gain allowable range different from the first gain allowable range in the second section 302. In this case, the second gain allowable range may be a range wider than at least the first gain allowable range. In particular, the first gain allowable range may represent a loudness gain range that includes loudness gain values that are less than a first maximum gain value. Also, the second gain allowable range may indicate a loudness gain range that includes loudness gain values that are less than a second maximum gain value. In this case, the first maximum gain value may be a value smaller than the second maximum gain value. Hereinafter, in the present disclosure, the first gain allowable range indicates a gain allowable range used in the above-described gain limitation section.

Figure 4:
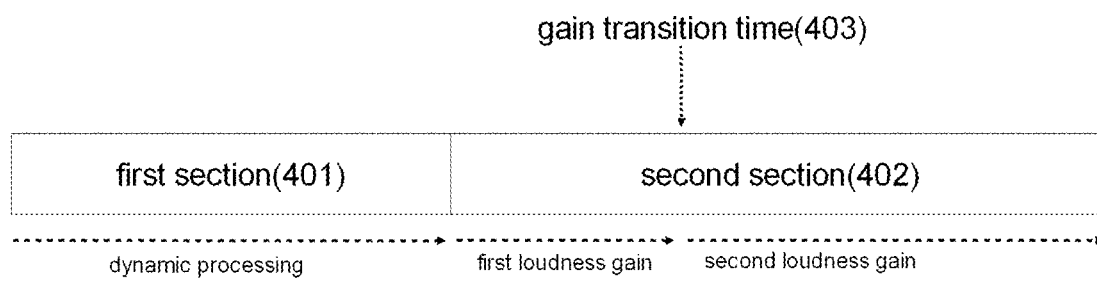
FIG. 4 is a diagram illustrating a method of determining a loudness gain for each section of input content according to an embodiment of the present disclosure.

According to an embodiment of the present disclosure, the loudness gain of the input content may be obtained in different ways according to sections of the input content. In this disclosure, the loudness gain of the input content may represent the loudness gain applied to the input content. FIG. 4 is a diagram illustrating a method of determining a loudness gain for each section of input content according to an embodiment of the present disclosure.

In FIG. 4, the method of obtaining the loudness gain applied to the input content in a first section 401, which is the gain limitation section, and a second section 402, which is the limitation release section, may be different from each other. For example, the loudness gain of the input content in the first section 401 may be a dynamic gain that is updated in real time. The first section 401 may be an initial period in which the loudness analysis for the input content is not performed at a certain level or more. Accordingly, the audio signal processing apparatus may update the loudness gain of the input content in the first section 401 according to a predetermined update period. In this case, the predetermined update period may be a time of frame unit. For example, the loudness gain may be updated for each frame. Also, the predetermined update period may be the same as a period at which the loudness information is updated. In this case, the period in which the loudness information is updated may be the same as a measurement period in which the loudness measurement for the input content is performed. For example, the predetermined update period may be 100 ms.

On the other hand, in the second section 402, the loudness gain of the input content may be a static gain that is not updated in real time. In the present disclosure, the static gain may represent a gain that is updated only under certain conditions. A loudness measurement value of a certain level or more may be accumulated during the first section 401 preceding the second section 402. Accordingly, in the second section 402, the audio signal processing apparatus may adjust the output loudness level of the input content based on the static gain. The audio signal processing apparatus may apply a first loudness gain to the input content in the second section 402. In this case, the first loudness gain may represent the value of the static gain used in the second section 402. In addition, the audio signal processing apparatus may output the output content to which the first loudness gain is applied, in the second section 402.

According to one embodiment, the first loudness gain used in the second section 402 may be a value determined based on the loudness information analyzed during the first section 401. In this case, the first section 401 may be a loudness analysis section. For example, the audio signal processing apparatus may analyze the loudness of the input content during the first section 401 to obtain the loudness information. For example, the loudness information may include a first integrated loudness level accumulated during the first section 401. The audio signal processing apparatus may obtain the first integrated loudness level based on loudness measurement values measured until the end of the first section 401. In addition, the audio signal processing apparatus may obtain the first loudness gain based on the first integrated loudness level. The audio signal processing apparatus may adjust the output loudness level of the input content that is reproduced after the first section 401 based on the first loudness gain.

According to a further embodiment, the static gain applied to the input content in the second section 402 may be changed to a different value in certain situations. For example, when the output loudness level deviates from a predetermined dynamic range by more than a predetermined ratio, the audio signal processing apparatus may update the static gain. In addition, the audio signal processing apparatus may determine whether to update the static gain based on the number of frames which is output at an output loudness level out of the predetermined dynamic range. For example, the audio signal processing apparatus may obtain the ratio of the frames whose output loudness levels deviate from the predetermined dynamic range, among frames of the specific section reproduced in advance. In this case, the frame indicates a frame included in the input content. Further, when the obtained ratio is equal to or greater than a predetermined value, the audio signal processing apparatus may change the static gain from the first loudness gain to a second loudness gain.

Specifically, the second loudness gain may be obtained based on the loudness information analyzed with respect to the input content from the start of the first section 401 to current time point. The audio signal processing apparatus may obtain a second integrated loudness level based on the loudness measurement values obtained from the start of the first section 401 to the current time point. Further, the audio signal processing apparatus may obtain the second loudness gain based on the second integrated loudness level. The audio signal processing apparatus may adjust the output loudness level of the input content based on the second loudness gain from a gain transition time 403.

According to a further embodiment, the audio signal processing apparatus may adjust the output loudness level of the input content based on the first loudness gain and the second loudness gain for a predetermined time from the gain transition time 403. This is because the output loudness level may rapidly increase or decrease due to a difference between the first loudness gain and the second loudness gain. For example, the audio signal processing apparatus may obtain the loudness gain per specific time unit by weighted summing the first loudness gain and the second loudness gain by a specific time unit for a preset time from the gain transition time 403. In this case, the loudness gain for each specific time unit may represent a loudness gain smoothed from the first loudness gain and the second loudness gain. Also, the specific time unit may represent a frame unit. The audio signal processing apparatus may adjust the output loudness level of the input content based on the smoothed loudness gain from the gain transition time 403 for a predetermined time.

According to one embodiment, the predetermined time may be determined based on the first loudness gain and the second loudness gain. For example, the audio signal processing apparatus may compare the first loudness gain and the second loudness gain. Further, the audio signal processing apparatus may determine the predetermined time based on the comparison result. If the first loudness gain is smaller than the second loudness gain, the loudness level of the input content may be gradually decreased. On the other hand, if the first loudness gain is larger than the second loudness gain, the loudness level of the input content may be gradually increased. If the loudness gain is not rapidly reduced in a situation where the loudness level of the input content gradually increases, auditory sense of a listener may be impaired. Thus, the predetermined time may be set to be shorter in a second case where the first loudness gain is larger than the second loudness gain, than in a first case where the first loudness gain is less than the second loudness gain.

According to one embodiment, the loudness gain per time unit may vary depending on the parameter indicating a rate of change of the loudness gain per time unit. The audio signal processing apparatus may obtain the parameter indicating the rate of change of the loudness gain per time based on the result of the loudness gain comparison. For example, the parameter may be set to a value corresponding to a faster rate of change in the second case where the first loudness gain is greater than the second loudness gain, than in the first case where the first loudness gain is less than the second loudness gain. Equation 1 shows an embodiment of a method by which the audio signal processing apparatus obtains a smoothed loudness gain.

$$\text{Gain}'(i) = \text{gain\_array\_}i * \text{Smoothing\_filter\_coeff} \quad \text{[Equation 1]}$$

$$\text{Smoothing\_filter\_coeff} = [$$
$$\text{smoothing\_filter\_coeff}(1); \text{smoothing\_filter\_coeff}(2);$$
$$\ldots \text{smoothing\_filter\_coeff}(N)]$$

$$\text{Smoothing\_filter\_coeff}(n) =$$
$$c^n / \{c^N + c^{(N-1)} + c^{(N-2)} + \ldots c^{(1)}\}$$

$$\text{Smoothing\_filter\_coeff}(1) + \text{Smoothing\_filter\_coeff}(2) +$$
$$\ldots + \text{Smoothing\_filter\_coeff}(N) = 1$$

In Equation (1), i may represent the i-th frame of the input content. N may represent a size of a gain array. Specifically, the size of the gain array may be a size of a gain buffer storing the loudness gain values. n may be an integer from 1 to N. Also, gain_array_i may be a gain array storing N consecutive gains including loudness gains of the (i−N−1)-th frame to the i-th frame. The audio signal processing apparatus may obtain the smoothed loudness gain applied to the i-th frame by applying a smoothing filter coefficient Smoothing_filter_coeff corresponding to each frame-specific loudness gain included in the gain array. Also, c may represent a parameter indicating the rate of change of the time-dependent loudness gain. In this case, the larger the value of c, the faster the change rate. Thus, c may be set to a larger value in the second case where the first loudness gain is greater than the second loudness gain, than the first case where the first loudness gain is less than the second loudness gain.

Meanwhile, when a plurality of input contents is sequentially reproduced, the input content may be transitioned from a first input content to a second input content. Accordingly, a state in which the loudness measurement value of the input content is smaller than a predetermined loudness level may be maintained for a predetermined time in the limitation release section. In this case, the above-described gain limitation section may be restarted. Hereinafter, a condition in which the gain limitation section is restarted according to an embodiment of the present disclosure will be described with reference to FIG. 5.

Figure 5:
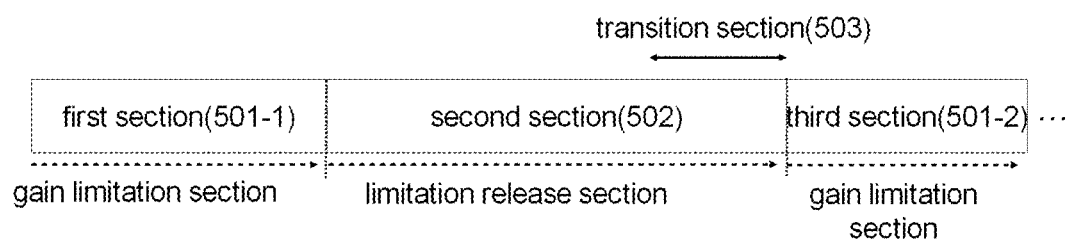
FIG. 5 is a diagram illustrating a transition section according to an embodiment of the present disclosure.

FIG. 5 is a diagram illustrating a transition section according to an embodiment of the present disclosure. In the present disclosure, the transition section may represent a section in which loudness characteristics are transitioned. That is, the transition section may include a certain time before and after the time when the input content is transitioned from a first content to a second content. However, the transition section of the present disclosure is not limited thereto. For example, the transition section may include a predetermined time interval before and after loudness characteristics are transitioned exceeding a certain level in a single content.

According to an embodiment of the present disclosure, the audio signal processing apparatus may set a gain limitation section based on loudness measurement values of the input content measured in a first section 501-1, which is the limitation release section. For example, the loudness measurement values for the input content obtained during the transition section 503 longer than a predetermined time from a reference time on a second section 502, which is the limitation release section, may be smaller than a predetermined loudness level. In this case, the audio signal processing apparatus may limit the loudness gain of the input content that is reproduced after the transition section 503. In this case, the loudness gain of the input content may be limited based on a first gain allowable range. Here, the predetermined loudness level may be a value set based on the loudness level of the audio signal which is almost soundless. According to one embodiment, the predetermined loudness level may be a value that is set based on a loudness level that is hard to be perceived by auditory. For example, the predetermined loudness level may be a value set based on −70 LKFS. In addition, the predetermined time may be 1000 ms.

Specifically, the audio signal processing apparatus may obtain a first loudness measurement value at a first time point according to a loudness measurement period. In addition, the audio signal processing apparatus may obtain a second loudness measurement value at a second time point, which is a measurement period subsequent to the first time point. In this case, if the first loudness measurement value is larger than the predetermined loudness level and the second loudness measurement value is smaller than the predetermined loudness level, the audio signal processing apparatus may determine the second time point as new reference time. Also, if the loudness measurement values obtained during the duration of the transition section from the second time point are smaller than the predetermined loudness level, the audio signal processing apparatus may limit the loudness gain of the input content to be reproduced during the third section 501-2. In this case, the third section 501-2 may be a period during a predetermined duration from the end of the transition section 503. Also, the duration of the third interval 501-2 may be set to the same value as the duration of the first section 501-1, which is the gain limitation section before the second section 502.

According to another embodiment, when a third loudness measurement value measured at a third time point before the end of the transition section 503 with respect to the second time point is greater than the predetermined loudness level, the audio signal processing apparatus may change the reference time to after the third time point. The audio signal processing apparatus may determine the time at which the third section 501-2 starts based on the loudness measurement values as described above. In addition, the audio signal processing apparatus may limit the loudness gain applied to the input content in the third section 501-2 based on the first gain allowable range.

As described above, the loudness information may include integrated loudness level representing loudness measurement value accumulated from a set-up point set by the audio signal processing apparatus. In this case, the set-up time may be reset based on the loudness measurement values for the input content. Hereinafter, a method for setting the set-up time for obtaining the integrated loudness level by an audio signal processing apparatus according to an embodiment of the present disclosure will be described with reference to FIG. 6.

Figure 6:
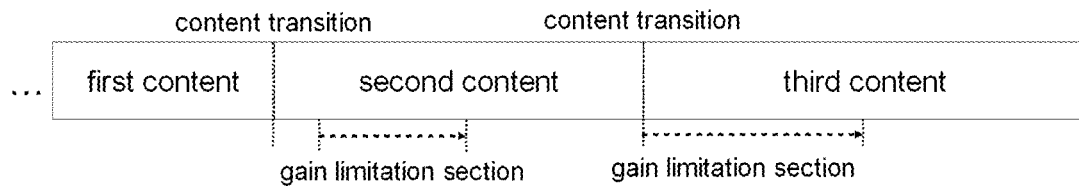
FIG. 6 is a diagram illustrating a method of setting a set-up time for obtaining an integrated loudness level by an audio signal processing apparatus according to an embodiment of the present disclosure.

FIG. 6 is a diagram illustrating a method of setting a set-up time for obtaining an integrated loudness level by an audio signal processing apparatus according to an embodiment of the present disclosure. In the embodiment of FIG. 6, when the input content is transitioned from a first content to a second content, the audio signal processing apparatus may reset the set-up time. For example, the audio signal processing apparatus may use the time point at which the input content transitions from the first content to the second content as the second set-up time corresponding to the second content. In this case, a second integrated loudness level for the second content may be obtained based on loudness measurement values accumulated from the second set-up time. In addition, the audio signal processing apparatus may obtain the loudness gain of the second content based on the second integrated loudness level. The audio signal processing apparatus may adjust the output loudness level of the second content based on the obtained loudness gain.

According to an embodiment, the audio signal processing apparatus may obtain information with respect to content transition time when reproduce of the first content ends and reproduce of the second content starts. For example, the audio signal processing apparatus may obtain information with respect to the content transition time from the additional information of the input content. The additional information may include program organizing information of a specific channel. The additional information may include a time at which the input content ends.

Further, the audio signal processing apparatus may obtain a content transition time based on the user input. For example, the audio signal processing apparatus may receive user input to switch the channel. In this case, the audio signal processing apparatus may obtain the content transition time based on the time point when the channel switch input is received. When the content is transitioned, a gain limitation section of the transitioned content may start within a predetermined time from the content transition time. In this case, the duration of the gain limitation section may be different for each content. Referring to FIG. 6, the duration of the gain limitation section of the second content and the duration of the gain limitation section of a third content may be different from each other.

Meanwhile, the audio signal processing apparatus may not receive the content transition time from an external device. In this case, the audio signal processing apparatus may predict the content transition time. According to an embodiment of the present disclosure, an audio signal processing apparatus may predict a content transition time based on a loudness measurement value. For example, the audio signal processing apparatus may determine whether to reset the set-up time based on the loudness measurement value and the integrated loudness level at the current time. The audio signal processing apparatus may determine whether to reset the set-up time based on a difference between the loudness measurement value and the integrated loudness level at the current time. Alternatively, the audio signal processing apparatus may determine whether to reset the set-up time based on a ratio between the loudness measurement and the integrated loudness level at the current time.

According to a specific embodiment, if a difference between the loudness measurement and the integrated loudness level is greater than a predetermined size at the current time, the audio signal processing apparatus may use the current time point as a new set-up time. Also, the audio signal processing apparatus may use the time point at which the transition section ends as a new setup time. In addition, when the setup time is reset, the audio signal processing apparatus may obtain the loudness gain for the input content to be reproduced after the reset set-up time. In this case, the audio signal processing apparatus may obtain the loudness gain for the input content to be reproduced after the reset set-up time using the integrated loudness level accumulated from the reset set-up time.

According to a further embodiment, if the difference between the loudness gain up to the transition section and the loudness gain after the transition section is large, the listener may experience inconvenience. Accordingly, the audio signal processing apparatus may obtain the final loudness gain applied during the duration of the gain limitation section after the transition section, using at least part of a third loudness gain applied until the transition section.

For example, the audio signal processing apparatus may analyze the input content reproduced until the transition section to obtain a first loudness information. The audio signal processing apparatus may obtain the third loudness gain based on the first loudness information. In addition, the audio signal processing apparatus may analyze the input content reproduced up to the present time after the transition section to obtain a second loudness information. The audio signal processing apparatus may obtain a fourth loudness gain based on the second loudness information.

Next, the audio signal processing apparatus may obtain the final loudness gain of the input content by weight summing the third loudness gain and the fourth loudness gain. In this case, a first weight applied to the third loudness gain may be a value smaller than a second weight applied to the fourth loudness gain.

Meanwhile, a specific input content may include a certain section in which the loudness measurement value for the input content is kept relatively small compared to other sections. In this case, the loudness measurement value corresponding to the corresponding section may not be suitable for utilization as the loudness information of the input content. Accordingly, the audio signal processing apparatus according to an embodiment of the present disclosure may obtain loudness information based on loudness measurement values excluding some of loudness measurement values among a plurality of loudness measurement values measured from the start of reproduction of the input content to the current time, may be obtained. For example, the loudness measurement values which is measured between the start time of the transition interval and the time when loudness over a predetermined level may be excluded.

According to one embodiment, the audio signal processing apparatus may delete data with respect to a part of a plurality of loudness measurement values stored in a storage unit of the audio signal processing apparatus. For example, the audio signal processing apparatus may include the storage unit for storing loudness measurement values. However, the present disclosure is not limited thereto, and the audio signal processing apparatus may store loudness measurement values for the input content in a storage other than the audio signal processing apparatus. The audio signal processing apparatus may also delete data with respect to a part of the loudness measurement values stored in a storage external to the audio signal processing apparatus.

Specifically, the audio signal processing apparatus may delete data with respect to loudness measurement values measured between a time point at which a transition section starts and a time point at which loudness exceeding a predetermined level is measured. In this case, the deleted measurement values may be the part of the plurality of the pre-stored loudness measurement values. Thereby, the audio signal processing apparatus may reduce the data storage capacity necessary for adjusting the output loudness level. Further, the audio signal processing apparatus may efficiently adjust the output loudness level of the input content.

Meanwhile, in the above-described embodiments, the output loudness level of the input content may be adjusted based on the additional information associated with the input content. Hereinafter, a method for adjusting the output loudness level of the input content using the additional information related to the input content according to an embodiment of the present disclosure will be described. Hereinafter, the additional information indicates additional information associated with the input content. The audio signal processing apparatus may adjust the output loudness level of the input content in different ways according to the additional information.

Figure 7:
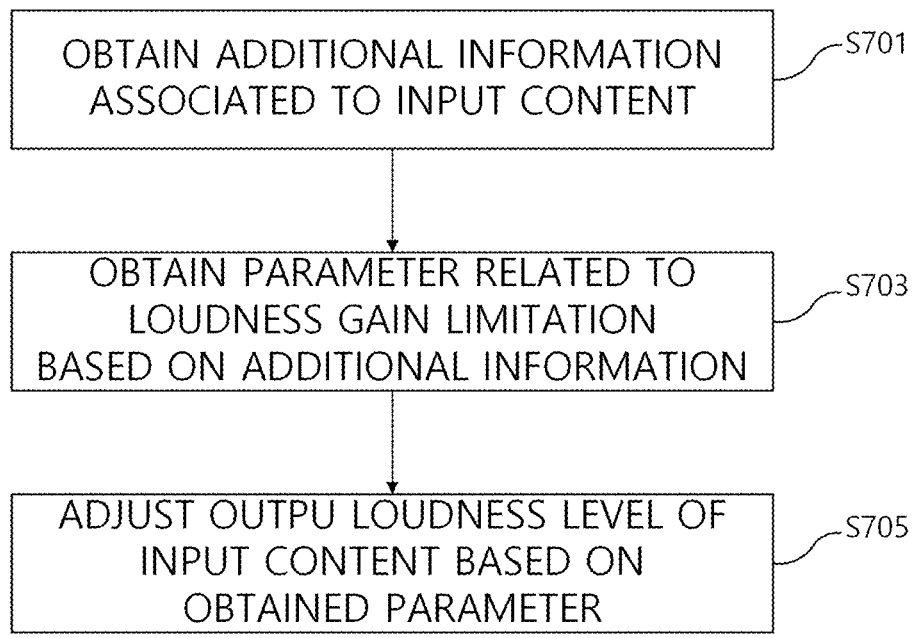
FIG. 7 is a flowchart illustrating a method of adjusting an output loudness level of an input content based on additional information by an audio signal processing apparatus according to an embodiment of the present disclosure.

FIG. 7 is a flowchart illustrating a method of adjusting an output loudness level of an input content based on additional information by an audio signal processing apparatus according to an embodiment of the present disclosure. Referring to FIG. 7, in step S701, the audio signal processing apparatus may obtain additional information. For example, the audio signal processing apparatus may obtain additional information from an external. Specifically, the audio signal processing apparatus may receive additional information related to a content through an external server. The audio signal processing apparatus may be an apparatus for outputting input content received in real time such as an Internet TV or a cable TV. In this case, the audio signal processing apparatus may receive the additional information at least before completing the reception of the entire section of the input content. According to one embodiment, the additional information may include at least one of a start point, an end point, or a length of the content. Further, the additional information may include at least one of information indicating genre, popularity, a viewing count, or the content providers. Further, the additional information may include a loudness dynamic range of the content.

According to one embodiment, the audio signal processing apparatus may obtain the additional information related to the input content based on the additional information. For example, when the additional information does not include the length information of the input content, the audio signal processing apparatus may predict the length of the input content using information other than the length of the input content. In this case, information other than the length of the input content may be included in the additional information related to the input content.

Specifically, the audio signal processing apparatus may obtain information on the length of the input content based on the genre of the input content. A predetermined length corresponding to a genre of an input content may be set to the length of the input content. If the genre of the input content is classical music, the audio signal processing apparatus may use a predetermined content length corresponding to the classical music as the length of the input content. The predetermined content length corresponding to the classical music may be 45 minutes. If a genre of an input content is an advertisement, the predetermined content length may be 10 seconds. This is a method for obtaining supplementary information based on additional information, but the present disclosure is not limited thereto. For example, when the additional information does not include information on the genre of the input content, the audio signal processing apparatus may predict the genre of the input content based on the additional information.

Next, in step S703, the audio signal processing apparatus may determine a parameter associated with the loudness gain limitation based on the obtained additional information. For example, the parameter associated with the loudness gain limitation may include at least one of a gain allowable range or duration of a gain limitation section. For example, a first gain allowable range used in the gain limitation section may be obtained based on the additional information.

According to one embodiment, the audio signal processing apparatus may determine a first gain allowable range based on the genre of the input content. The audio signal processing apparatus may obtain the genre of the input content based on the length of the input content. Also, the audio signal processing apparatus may use a predetermined range corresponding to the genre of the input content as the first gain allowable range in the limitation section. Specifically, the audio signal processing apparatus may determine the first gain allowable range based on the gain allowable range table for each predetermined genre of the content.

According to another embodiment, the audio signal processing apparatus may determine a first gain allowable range based on the content length of the input content. For example, the audio signal processing apparatus may obtain information on the length of the input content from the additional information. Next, the audio signal processing apparatus may determine the first gain allowable range based on the length of the input content.

According to an embodiment of the present, the above-described duration of the gain limitation section may be obtained based on the additional information. The audio signal processing apparatus may obtain the duration of a first section, which is the gain limitation section of the input content, based on the above-described additional information. For example, the audio signal processing apparatus may determine the duration of the first section based on the length of the input content. According to a specific embodiment, the audio signal processing apparatus may obtain information on the length of the input content from the additional information. Next, the audio signal processing apparatus may determine the duration of the first section based on the length of the input content. In this case, the duration of the first section may be shorter than a duration of a section in which a loudness gain of other contents of which a length is longer than the length of the input content.

For example, the duration of the gain limitation section may be set to a longer value as the length of the content is longer. If a length of a first input content is longer than a length of a second input content, a first duration corresponding to a gain limitation section of the first input content may be longer than a second duration corresponding to a gain limitation section of the second input content. The duration of the gain limitation section may be proportional to the length of the content.

In addition, the duration of the gain limitation section may be determined according to a content length range to which the length of the content belongs. For example, if the length of each of the first input content and the second input content is included in a first content length range, the first duration and the second duration may be the same value. On the other hand, if a length of a third input content is not included in the first content length range, a third duration corresponding to the gain limitation section of the third input content may be different from the first duration. In this case, the third duration may be determined according to a second content length range to which the length of the third input content belongs. If the lengths of the first content length range are longer than the lengths of the second content length range, the third duration may be shorter than the first duration.

Further, the audio signal processing apparatus may determine the duration of the gain limitation section based on a result of comparing the length of the input content with a preset reference length. For example, if the first input content and the second input content are longer than the reference length, the audio signal processing apparatus may use a first predetermined duration as the first duration and the second duration. On the other hand, when the length of the third input content is shorter than the reference length, the audio signal processing apparatus may use a second predetermined duration as the third duration. In this case, the first predetermined duration may be longer than the second predetermined duration. According to a specific embodiment, the audio signal processing apparatus may receive input content having a content length of 20 minutes. The audio signal processing apparatus may set ¼ of the content length to the gain limitation section based on the content length. In this case, the gain limitation section of the content may be 5 minutes.

According to another specific embodiment, when the length of the input content is shorter than the preset reference length, the duration of the gain limitation section of the input content may be the entire section in which the input content is reproduced. For example, the third input content may have a shorter content length than the preset reference length. In this case, the audio signal processing apparatus may limit the loudness gain of the third input content based on the first gain allowable range for the entire section in which the third input content is reproduced.

Next, in step S705, the audio signal processing apparatus may adjust the output loudness level of the input content based on the obtained parameters. Specifically, the audio signal processing apparatus may limit the loudness gain of the input content that is reproduced during duration of the gain limitation section from a specific time point when the gain limitation section starts. In this case, the duration of the gain limitation section may be duration obtained based on the additional information of the input content in step S403. Further, the audio signal processing apparatus may limit the loudness gain of the input content based on the first gain allowable range obtained in step S403. In addition, the audio signal processing apparatus may adjust the output loudness gain of the input content based on the limited loudness gain.

Accordingly, the apparatus for processing an audio signal according to an embodiment of the present disclosure may prevent excessive amplification of loudness at the beginning of the input content. In addition, the audio signal processing apparatus may limit the loudness gain in different ways depending on the length of the input content. For example, in the case of an input content having a relatively short content length, the duration of the gain limitation section may be shorter than that of an input content having a long content length. Thus, the audio signal processing apparatus may efficiently adjust the output loudness level of the input content. In addition, the audio signal processing apparatus may provide various loudness environments to the user by limiting the loudness gain in different ways according to the genre of input content.

Figure 8:
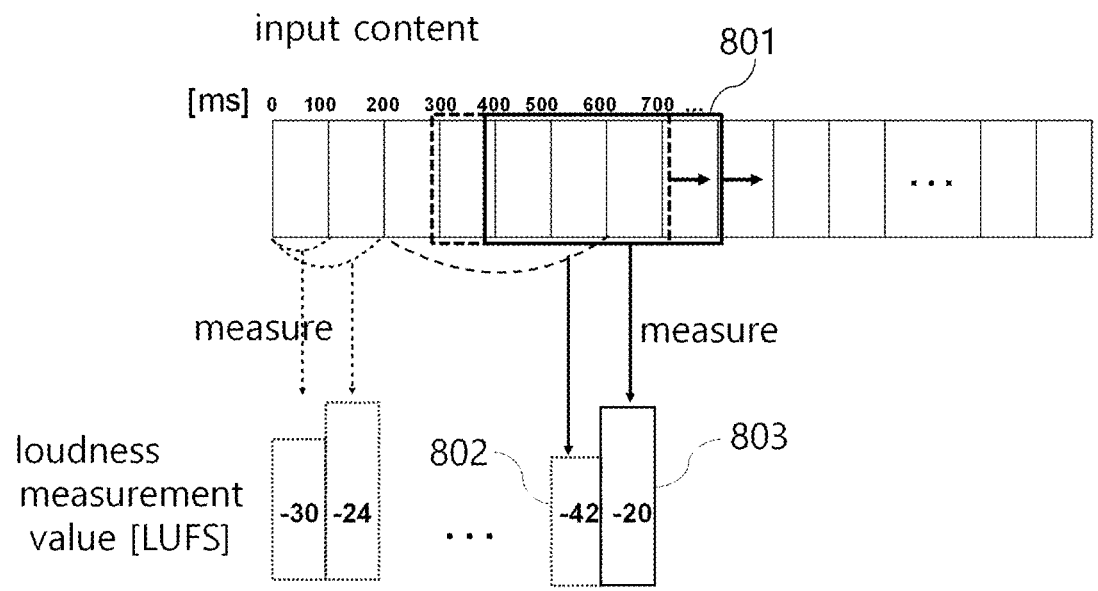
FIG. 8 is a diagram illustrating a method of measuring loudness of an input content by an audio signal processing apparatus according to an embodiment of the present disclosure.

Hereinafter, a method of obtaining loudness measurement values by an audio signal processing apparatus according to an embodiment of the present disclosure will be described in detail with reference to FIG. 8. FIG. 8 is a diagram illustrating a method of measuring loudness of an input content by an audio signal processing apparatus according to an embodiment of the present disclosure. According to one embodiment, the audio signal processing apparatus may measure the loudness of the input content based on a measurement window described above. In addition, the audio signal processing apparatus may obtain loudness measurement value per measurement window of the input content. The audio signal processing apparatus may obtain loudness information based on the loudness measurement value per measurement window.

In the embodiment of FIG. 8, the audio signal processing apparatus may obtain measurement value per measurement window 801 based on a length of the measurement window 801. In this case, the length of the measurement window 801 may be a default value pre-stored in the audio signal processing apparatus. According to one embodiment of the present disclosure, the length of the measurement window 801 may vary depending on the input content. For example, the audio signal processing apparatus may obtain the length of the measurement window corresponding to the input content based on additional information of the input content. In the embodiment of FIG. 7, the length of the measurement window corresponding to the input content may be 400 ms. The audio signal processing apparatus may obtain a loudness measurement value corresponding to a specific 400 ms long section in the whole section of the input content.

According to one embodiment, the length of the measurement window may be obtained based on the additional information. For example, the length of the measurement window may be obtained based on a loudness range of the input content. Here, the loudness range may be a value indicating a loudness level distribution for the entire section of the content. The loudness range may be expressed in units of a relative measurement value such as an LU. The audio signal processing apparatus may obtain information on the loudness range of the input content from the additional information. Next, the audio signal processing apparatus may determine the length of the measurement window based on the loudness range of the input content. In this case, the length of the measurement window of the input content may be set to a value shorter than a length of a measurement window of the other content having the width of the loudness range wider than the loudness range of the input content. For example, if a loudness range of a first input content is greater than a loudness range of a second input content, a length of a measurement window for the first input content may be greater than a length of a measurement window for the second input content.

In addition, the audio signal processing apparatus may obtain the loudness measurement per measurement window according to a measurement period for obtaining the measurement value for the input content. In the present disclosure, the measurement period may represent the temporal distance over which the measurement window is moved. Referring to FIG. 8, a first measurement value 802 may be a loudness measurement value corresponding to a (300 ms~700 ms) period based on a time point at which the input content starts to be reproduced. In addition, a second measurement value 803 may be a loudness measurement value corresponding to a (400 ms~800 ms) period based on a time point at which the input content starts to be reproduced. When the length from the time when the input content starts to be reproduced to the current time point is shorter than the length of the measurement window, the audio signal processing apparatus may obtain the loudness measurement value at the nearest measurement period that comes after the current time point. In this case, the audio signal processing apparatus may obtain the loudness measurement value corresponding to a section shorter than the length of the measurement window.

Specifically, the audio signal processing apparatus may determine the measurement period based on the additional information. For example, the measurement period may be determined based on the length of the input content. For example, if a length of a second input content is longer than a length of a first input content, a measurement period of a first input content may be shorter than a measurement period of a second input content. Further, the audio signal processing apparatus may obtain the loudness measurement value per measurement window based on the determined measurement period. In the embodiment of FIG. 8, the measurement period may be 100 ms. The audio signal processing apparatus may move the measurement window every 100 ms to obtain the loudness measurement value per measurement window. In addition, the audio signal processing apparatus may obtain the above-described loudness information based on the plurality of the loudness measurement values through FIG. 8.

Meanwhile, according to an embodiment, the length of the measurement window may be set to a different value in each of the gain limitation section and the limitation release section of the input content. For example, a length of a measurement window at the gain limitation section may be shorter than a length of a measurement window at the limitation release section. In addition, the measurement period may be set to a different value in each of the gain limitation section and the limitation release section of the input content. For example, in the gain limitation section, the measurement period may be shorter than the measurement period in the limitation release section. This is because the gain limitation section may be an initial period in which the loudness analysis of the input content is not performed over a certain level. Also, since the limitation release section is a period after the gain limitation section, the loudness analysis for the input content may be performed over a certain level.

According to a further embodiment, the audio signal processing apparatus may adjust the output loudness level of the input content based on the frequency response of an output of a device reproducing the input content. Specifically, a cut-off frequency of an output unit of the device reproducing the input content may be 400 Hz. In this case, the audio signal processing apparatus may measure the loudness of the input content using a first filter that passes a frequency component higher than the cut-off frequency. In this case, the first filter may be a high-pass filter. That is, the audio signal processing apparatus may generate a second filter based on the loudness filter and the first filter. In addition, the audio signal processing apparatus may apply the second filter to at least a part of the input content to obtain loudness measurement values. Alternatively, the audio signal processing apparatus may apply the loudness filter and the first filter to at least a part of the input content to generate a plurality of filtered signals. In this case, the audio signal processing apparatus may combine the plurality of filtered signals to obtain the loudness measurement values.

Figure 9:
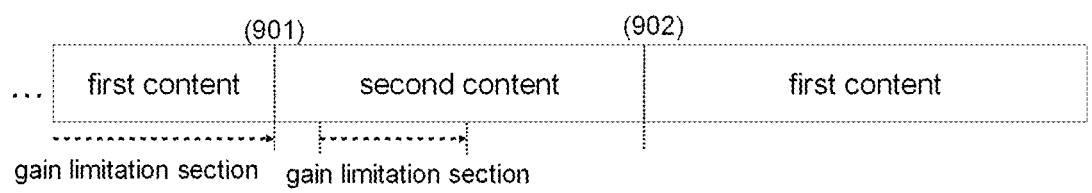
FIG. 9 is a diagram illustrating a method of adjusting an output loudness level of an input content when contents are changed according to an embodiment of the present disclosure.

FIG. 9 is a diagram illustrating a method of adjusting an output loudness level of input content when contents are transitioned according to an embodiment of the present disclosure. According to an embodiment of the present disclosure, even when the input content is transitioned from a first content to a second content, the audio signal processing apparatus may store loudness information for the first content for a predetermined time. The first content may be reproduced again. Specifically, when the content is transitioned by a user input switching the channel, the audio signal processing apparatus may receive a user input to return to the previous channel again.

Accordingly, the audio signal processing apparatus may store the loudness information for the first content analyzed during a predetermined information holding time from a first transition time 901 at which the input content is transitioned from the first content to the second content. According to an embodiment, when the first content is reproduced again within the predetermined information holding time based on the first transition time 901, the audio signal processing apparatus may use the stored loudness information. The audio signal processing apparatus may obtain the loudness gain of the input content that is reproduced after a second transition time 902 based on the loudness information obtained before the first transition time 901. The second transition time 902 may be a time point at which the first content starts to be reproduced again. On the other hand, if the first content is not reproduced within the predetermined information holding time, the audio signal processing apparatus may delete the analyzed loudness information for the first content. Thus, the audio signal processing apparatus may efficiently manage the storage memory. In addition, when the first content is reproduced again, the audio signal processing apparatus may shorten the time required to obtain loudness information over a predetermined level for the first content.

According to a further embodiment, the gain limitation section may be continuous. For example, before the first transition time 901, the duration of the gain limitation section of the first content may not be fully elapsed. In this case, a portion of the section in which the first content is reproduced after the second transition time 902 may be defined as a gain limitation section. In this case, the gain limitation section may start within a predetermined time with respect to the second transition time. Also, the duration of the gain limitation section set after the first transition time may be the remaining portion of the entire duration of the gain limitation section that has not elapsed before the first transition time 901. Specifically, when the duration of the gain limitation section of the first content is 1200 ms and the duration lapse before the first transition time is 600 ms, the gain limitation section is set for at least 600 ms from a specific time point after the second transition time 902. The audio signal processing apparatus may limit the loudness gain of the first content based on a first gain allowable range during the corresponding period.

Figure 10:
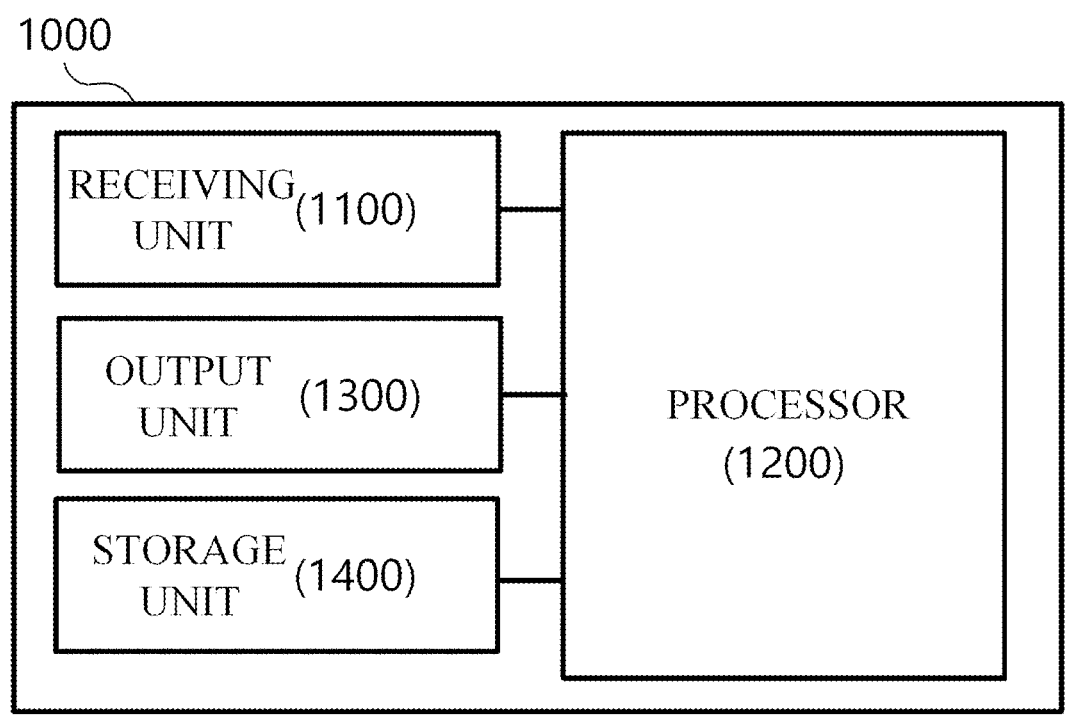
FIG. 10 is a block diagram illustrating a configuration of an audio signal processing apparatus according to an embodiment of the present disclosure.

FIG. 10 is a block diagram showing a configuration of an audio signal processing apparatus 1000 according to an embodiment of the present disclosure. According to an embodiment, the audio signal processing apparatus 1000 may include a receiving unit 1100, a processor 1200, and an output unit 1300. However, not all of the elements illustrated in FIG. 10 are essential elements of the audio signal processing apparatus. The audio signal processing apparatus 1000 may additionally include elements not illustrated in FIG. 10. Furthermore, at least some of the elements of the audio signal processing apparatus 1000 illustrated in FIG. 10 may be omitted. For example, the audio signal processing apparatus according to an embodiment may not include the receiving unit 1100 and the output unit 1300.

The receiving unit 1100 may receive an input content input to the audio signal processing apparatus 1000. The receiving unit 1100 may receive an input content whose output loudness level by the processor 1200 is adjusted. As described above, the input content may include an audio signal. In this case, the audio signal may include at least one of an ambisonics signal, an object signal, or a channel signal. In addition, the audio signal may be one object signal or a mono signal. The audio signal may be a multi-object or multi-channel signal. According to one embodiment, the receiving unit 1100 may include an input port for receiving the input content transmitted by wire. The receiving unit 1100 may include a wireless receiving module for receiving the input content transmitted wirelessly.

According to one embodiment, the audio signal processing apparatus 1000 may include a separate decoder. In this case, the receiving unit 1100 may receive an encoded bit stream of the input content. In addition, the encoded bit stream may be decoded into input content through a decoder. Additionally, the receiving unit 1100 may receive additional information related to the input content.

According to an embodiment, the receiving unit 1100 may include transmitting and receiving means for transmitting and receiving data to and from external devices through a network. In this case, the data may include at least one of bitstream or additional information of the input content. The receiving unit 1100 includes a wired transmitting/receiving port for receiving data transmitted through a wire. In addition, the receiver 1100 may include a wireless transmitting/receiving module for receiving wirelessly transmitted data. In this case, the receiver 1100 may receive data transmitted wirelessly using a Bluetooth or Wi-Fi communication method. Also, the receiver 1100 may receive data transmitted according to a mobile communication standard such as LTE (Long Term Evolution) and LTE-advanced, but the present disclosure is not limited thereto. The receiving unit 1100 may receive various types of data transmitted according to various wired and wireless communication standards.

The processor 1200 may control the overall operation of the audio signal processing apparatus 100. The processor 1200 may control each component of the audio signal processing apparatus 100. The processor 1200 may perform arithmetic processing and processing of various data and signals. The processor 1200 may be embodied in hardware in the form of a semiconductor chip or an electronic circuit, or may be embodied in software that controls hardware. The processor 1200 may be implemented as a combination of hardware and software. For example, the processor 1200 may control the operation of the receiving unit 1100, the output unit 1300, and the storage unit 1400 by executing at least one program. In addition, the processor 1200 may execute at least one program to perform the operations described above with reference to FIGS. 1-9.

According to one embodiment, the processor 1200 may adjust the output loudness level of the input content. For example, the processor 1200 may adjust the output loudness level of the input content based on the loudness gain. The loudness information may be the loudness characteristic of the input content analyzed from the input content. In this case, the loudness gain may be obtained based on the loudness information. In addition, the processor 1200 may limit the loudness gain based on the first gain allowable range during the gain limitation section. The processor 1200 may release the restriction on the loudness gain by the first gain allowable range in the gain cancellation interval subsequent to the gain limitation section. In addition, the processor 1200 may output the output content whose output loudness level is adjusted from the input content. In this case, the processor 1200 may output the output content through the output unit 1300, which will be described later.

According to one embodiment, the processor 1200 may obtain additional information. For example, the processor 1200 may receive additional information via the receiver 1100. The processor 1200 may determine the parameters associated with the gain limit based on the additional information. Specifically, the processor 1200 may obtain duration of the gain limitation section based on the additional information. In addition, the processor 1200 may limit the loudness gain of the input content based on the gain allowable range during duration obtained from the start of the gain limitation section.

The output unit 1300 may output the output content. The output unit 1300 may output the output content whose output loudness level is adjusted by the processor 1200 from the input content. Here, the output content may include an output audio signal. In this case, the output audio signal may include at least one of an ambisonics signal, an object signal, or a channel signal. The output audio signal may be a multi-object or multi-channel signal. The output audio signal may also include a two channel output audio signal corresponding to the amount of the listener, respectively. The output audio signal may comprise a binaural two channel output audio signal. The output unit 1300 may output the audio headphone signal whose output loudness level is adjusted by the processor 1200.

According to one embodiment, the output unit 1300 may include output means for outputting the output content. For example, the output unit 1300 may include an output port for outputting an output audio signal to an external. In this case, the audio signal processing apparatus 100 may output an output audio signal to an external device connected to an output terminal. The output unit 1300 may include a wireless audio transmission module for outputting an output audio signal to an external. In this case, the output unit 1300 may output the output audio signal to an external device using a wireless communication method such as Bluetooth or Wi-Fi.

Also, the output unit 1300 may include a speaker. In this case, the audio signal processing apparatus 100 may output the output audio signal through the speaker. The output unit 1300 may further include a converter (e.g., a digital-to-analog converter (DAC)) for converting a digital audio signal into an analog audio signal. In addition, the output unit 1300 may include display means for outputting a video signal included in the output content.

The storage unit 1400 may store at least one of data or programs for processing and controlling the processor 1200. For example, the storage unit 1400 may store loudness measurement values obtained through the processor 1200. In addition, the storage unit 1400 may store the results calculated by the processor 1200. For example, the storage unit 1400 may store loudness information obtained based on loudness measurement values. The storage unit 1400 may also store the integrated loudness level computed by the processor 1200. Also, the storage unit 1400 may store data input to or output from the audio signal processing apparatus 1000.

The storage unit 1400 may include at least one memory. The memory may be a flash memory type, a hard disk type, a multimedia card micro type, a card type memory (e.g., SD or XD memory), a Random Access Memory (RAM), a Static Random Access Memory (SRAM), a Read Only Memory (ROM), a EEPROM (Electrically Erasable Programmable Read-Only Memory), a PROM (Programmable Read-Only Memory) and an optical disc.

Some embodiments may also be implemented in the form of a recording medium including instructions executable by a computer, such as program modules, being executed by a computer. Computer readable media may be any available media that may be accessed by a computer, and may include both volatile and nonvolatile media, removable and non-removable media. The computer-readable medium may also include computer storage media. Computer storage media may include both volatile and nonvolatile, removable and non-removable media implemented in any method or technology for storage of information such as computer readable instructions, data structures, program modules or other data.

Although the present invention has been described using the specific embodiments, those skilled in the art could make changes and modifications without departing from the spirit and the scope of the present invention. That is, although the present disclosure has described an embodiment of adjusting the loudness level for an audio signal, the present disclosure is equally applicable and extendable to various multimedia signals including video signals as well as audio signals. Therefore, it is to be understood that within the scope of the present disclosure, those skilled in the art to which the present disclosure belongs may easily construe the description and the embodiments of the present disclosure.

What is claimed is:

1. An audio signal processing apparatus comprising:
a processor configured to adjust an output loudness level of an input content,
wherein the processor is configured to:
obtain loudness information analyzed from the input content,
obtain a loudness gain applied to the input content based on the loudness information and a target loudness level, and
adjust the output loudness level of the input content based on the loudness gain,
wherein in a first section among an entire section in which the input content is reproduced, the loudness gain is limited based on a first gain allowable range,
wherein the first gain allowable range includes loudness gain values which are less than a first maximum gain value, and
wherein in a second section following the first section, the limitation on the loudness gain is released so that a loudness gain value exceeding the first maximum gain value can be applied to the input content in the second section.

2. The audio signal processing apparatus of claim 1, wherein the first section is an initial period starting from a specific time point and having a predetermined duration.

3. The audio signal processing apparatus of claim 1, wherein, in the second section, the loudness gain is limited based on a second gain allowable range that is wider than at least the first gain allowable range.

4. The audio signal processing apparatus of claim 1, wherein the second gain allowable range includes loudness gain values which are less than a second maximum gain value, and
wherein the first maximum gain value is smaller than the second maximum gain value.

5. The audio signal processing apparatus of claim 1, wherein the processor is further configured to:
obtain additional information related to the input content, and
determine the first gain allowable range based on the additional information.

6. The audio signal processing apparatus of claim 5, wherein the processor is further configured to obtain information on a genre of the input content from the additional information, and
wherein the first gain allowable range is determined based on the genre of the input content.

7. The audio signal processing apparatus of claim 5, wherein the processor is further configured to obtain a duration of the first section based on the additional information, and
wherein the loudness gain of the input content reproduced during the duration of the first section from a specific time point at which the first section starts is limited based on the first gain allowable range.

8. The audio signal processing apparatus of claim 7, wherein the processor is further configured to obtain information on a length of the input content from the additional information, and
wherein, in a condition that a first content having longer length than the length of the input content, the duration of the first section is shorter than a duration of a section in which a loudness gain is limited among the first content.

9. The audio signal processing apparatus of claim 7, wherein the processor is further configured to:
obtain a loudness measurement value per measurement window for the input content, and
obtain the loudness information based on the loudness measurement value per measurement window,
wherein the measurement window represents a unit time used for obtaining one loudness measurement value.

10. The audio signal processing apparatus of claim 9, wherein when the loudness measurement value keeps smaller than a first predetermined loudness level during a predetermined or more time transition section from a specific time point in the second section, a loudness gain of the input content reproduced during a duration of the first section after the transition section is limited based on the first gain allowable range.

11. The audio signal processing apparatus of claim 10, wherein the processor is configured to obtain the loudness information by using one or more loudness measurement values among a plurality of loudness measurement values measured from a starting point of reproduction of the input content up to a current time point,
wherein loudness measurement values measured between a first time point at which the transition section starts and a second time point at which loudness exceeding a second predetermined level is measured are excluded when obtaining the loudness information.

12. The audio signal processing apparatus of claim 11, wherein the audio signal processing apparatus further comprises a storage unit storing a plurality of loudness measurement values, and
wherein the processor is further configured to delete data with respect to loudness measurement values pre-stored in the storage unit and measured between the first time point at which the transition section starts and the second time point at which loudness exceeding the second predetermined level is measured.

13. The audio signal processing apparatus of claim 10, wherein the processor is further configured to:
obtain a first loudness gain based on first loudness information of the input content reproduced until the transition section,
obtain a second loudness gain based on second loudness information of the input content reproduced until a current time point after the transition section, and
obtain the loudness gain to be reproduced after the current time point by weighted summing the first loudness gain and the second loudness gain,
wherein a first weight applied to the first loudness gain is smaller than a second weight applied to the second loudness gain.

14. The audio signal processing apparatus of claim 9, wherein the loudness information comprises an integrated loudness level indicating loudness measurement values integrated from a starting time set by the audio signal processing apparatus,
wherein the processor is further configured to obtain the loudness gain of the input content based on the integrated loudness level,
wherein the starting time is reset to the current time point when a difference between the loudness measurement at the current time point and the integrated loudness level is greater than a predetermined value.

15. The audio signal processing apparatus of claim 14, wherein when the loudness measurement value keeps smaller than a first predetermined loudness level during a predetermined or more time transition section from a specific time point in the second section, the starting time is reset to an end point of the transition section.

16. The audio signal processing apparatus of claim 5, wherein the additional information contains at least one of information indicating a length, a genre, popularity, a viewing count, a loudness dynamic range, or content provider of the input content.

17. An audio signal processing method for adjusting an output loudness level of an input content comprising the step of:
obtaining loudness information analyzed from the input content;
obtaining a loudness gain applied to the input content based on the loudness information and a target loudness level; and
adjusting the output loudness level of the input content based on the loudness gain,
wherein in a first section among an entire section in which the input content is reproduced, the loudness gain is limited based on a first gain allowable range,
wherein the first gain allowable range includes loudness gain values which are less than a first maximum gain value, and
wherein in a second section following the first section, the limitation on the loudness gain is released so that a loudness gain value exceeding the first maximum gain value can be applied to the input content in the second section.

18. The method of claim 17, wherein the first section is an initial period starting from a specific time point and having a predetermined duration.

19. The method of claim 17, wherein, in the second section, the loudness gain is limited based on second gain allowable range that is wider than at least the first gain allowable range.

20. The method of claim 17, wherein the method further comprises:
obtaining additional information related to the input content; and
obtaining duration of the first section based on the additional information,
wherein the loudness gain of the input content reproduced during the duration of the first section from a specific time point when the first section starts is limited based on the first gain allowable range.

* * * * *